United States Patent [19]

Selig et al.

[11] 4,112,196
[45] Sep. 5, 1978

[54] BEAM LEAD ARRANGEMENT FOR MICROELECTRONIC DEVICES

[75] Inventors: Thomas R. Selig, Kingston; Tugrul Yasar, Woodstock; Derek A. Coulton, Poughkeepsie, all of N.Y.

[73] Assignee: National Micronetics, Inc., Hurley, N.Y.

[21] Appl. No.: 762,005

[22] Filed: Jan. 24, 1977

[51] Int. Cl.² ............... H01C 17/28; H01L 23/48; H01L 23/50; H01L 23/54

[52] U.S. Cl. .................. 428/594; 29/621; 29/630 R; 29/590; 174/52 FP; 357/69; 428/630

[58] Field of Search ............ 29/621, 630, 590; 174/52 FP; 357/69; 428/594, 630

[56] References Cited

U.S. PATENT DOCUMENTS

| | | | |
|---|---|---|---|
| 3,699,010 | 10/1972 | Nash | 357/69 |
| 3,751,292 | 8/1973 | Kongable | 357/69 |
| 3,765,970 | 10/1973 | Athanas et al. | 357/69 |
| 3,838,984 | 10/1974 | Crane et al. | 428/594 |
| 3,942,187 | 3/1976 | Gelsing et al. | 357/69 |

*Primary Examiner*—Brooks H. Hunt

[57] ABSTRACT

An improved laminated beam lead for microelectronic devices, e.g., thin film resistors, integrated circuits or the like includes a first metal adhesion layer, e.g. tantalum nitride having disposed thereover a barrier metal such as palladium or platinum, and a bulk beam material, e.g., gold.

In accordance with one aspect of the present invention, a transverse discontinuity is formed in the barrier metalization layer such that normal forces applied to the end portion of the composite beam lead remote from the device chip will merely cause the beam lead to deform at the discontinuity rather than delaminating from the chip.

5 Claims, 3 Drawing Figures

BEAM LEAD ARRANGEMENT FOR MICROELECTRONIC DEVICES

DISCLOSURE OF THE INVENTION

This invention relates to microelectronic devices and more specifically, to an improved beam lead structure for making electrical and mechanical contact to such devices.

Beam leads have been widely employed in recent years to connect a microelectronic chip device, (e.g., thin film resistor or resistor network, integrated or hybrid circuit, or the like) to a substrate and external circuit. Such connections have been for mechanical mounting integrity and thermal conductivity purposes as well as effecting the requisite electrical signal and bias coupling. Each prior art composite beam lead is basically a cantilever, affixed about one end to the chip and overhanging and projecting beyond the chip periphery for connection (soldering, cold weld or the like) to a conductive pad or land on the substrate. FIG. 1 is a top view of a chip 1 having plural beam leads 2 thereon, and FIG. 2 depicts the chip 1 secured to land or pad areas 4 on a substrate 3 via the beam leads 2.

A typical beam lead comprises a three layer laminate disposed over a device-bearing silicon chip. Adhesive layers employed for various applications include tantalum, tantalum nitride, tantalum oxinitride, titanium, nichrome, cermet (metal disposed in a glass, e.g., silicon monoxide, matrix; barrier layers include palladium and platinum; and beam bulk materials include gold and aluminum. This metallurgical system forms a relatively strong chemical bond with the surface layer of the chip which is typically silicon dioxide or silicon nitride, among other passivation and/or insulation layers.

The first, or adhesion beam lead laminate layer (e.g., the titanium or tantalum in the above-enumerated illustrative beam lead composition provides a bond to the chip surface. The intermediate barrier metal (e.g., the palladium or platinum) prevents formation of an undesired intermetallic compound between the outer beam and adhesion layers and serves to securely bond to the two outer laminates, while the outer, beam metal (e.g., the gold) forms the body of the beams and provides the mechanical strength, electrical and thermal conductivity, and bondability to the circuit substrate.

The strength with which the chip is attached to its substrate depends principally upon: (a) the strength of the bonding interface between the beam and the chip surface; (b) the strength of the beam material; and (c) the strength of the bonding between the beam and the substrate bonding pad. A beam-lead chip will separate from its substrate if sufficient force is exerted to it. The failure will occur at the weakest point among the three listed above.

Usually for prior art beam leads, the weakest point is the interface between the beam leand and the surface layer of the chip. The strength of a beam and its adhesion to the chip are tested using a beam peel strength tester. The chip is attached to a substrate by an adhesive. A pneumatic tweezer grabs the tip of the beam and a measured, upward pull force is applied, perpendicular to the chip surface. Present methods of beam-lead manufacturing usually yield beams with peel strength of one gram or less per mil of beam width. The maximum peel strength observed rarely exceeds two gram per mil of beam width. Failure mode as previously mentioned is usually the delamination of beam from the chip surface.

The weakness of the structure at the beam-chip interface is a direct result of the junction or interface of different materials. Even though the adhesive layer and the chip surface material are chosen such that a chemical bonding results between them, dissimilarities in their chemical and mechanical properties is sufficient to make this interface the least strong among other joints. Built-in mechanical strain accentuated by differential thermal expansion exacerbate the weakness of the interface. Manufacturing imperfections such as adverse contamination at the interface and internal stress in the plated gold beams also weakens the attached beams.

The gold used in beam leads is highly ductile (Type III, Grade A). However, even with its high ductility and softness (Knoop hardness of 90) the beam acts like a cantilever. Through the cantilever action of the beam, external forces caused by vibrations, shock, acceleration, thermal expansion, and the like are directly applied to the beam-to-chip interface at the edge of the chip with the beam acting as a cantilever. Beam-to-chip bond is weakest at the edge of the chip where some damage is already built-in during processing of the beam-lead chip. This initial weakness and damage is present for various reasons. For example, undercutting during chemical etching processes results in a disturbed edge. The silicon itself is thinner and its passivating layer is partially unsupported around the edges of the chip. Once the beam starts to delaminate from the chip surface at the edge of the chip, the damage propagates and further weakens the interface along its length. This damage can be so severe that not only the interface but the different layers of the beam will be damaged and relieve their internal stresses by cracking.

It is an object of the present invention to provide an improved beam lead structure.

More specifically, it is an object of the present invention to provide a beam lead configuration characterized by substantially improved mechanical integrity and resistance to beam lead delamination from the chip surface.

The above and other objects of the present invention are realized in a specific, illustrative beam lead arrangement which interrupts and prevents the cantilever action of the beam from transmitting applied forces and propagating damage as delamination occurs. This is achieved by introducing a discontinuity in one of the layers forming the beam lead structure, e.g., in accordance with a preferred embodiment of this invention, in the barrier metal layer. The adhesion layer layout is formed using thin film and photolithographic techniques, and is continuous in the beam areas. The diffusion barrier metal layer is put on top of the adhesion layer, again as by thin film and photolithographic techniques and has the discontinuity described. The top, beam material layer has the same pattern as the adhesion layer, and is formed by thin film vacuum evaporation, electroplating or a combination of these techniques.

If a force is applied to the beam to cause it to tear apart from the chip surface the damage and delamination stops at the discontinuity. At the discontinuity the beam metal is not strongly bonded to the underlying adhesion layer and, therefore, can not exert peeling forces to the chip-to-beam interface.

The above and other features and advantages of the instant invention will become more clear from the following detailed description of a specific, illustrative beam lead configuration, considered in conjunction with the accompanying drawing in which.

Figure 1:
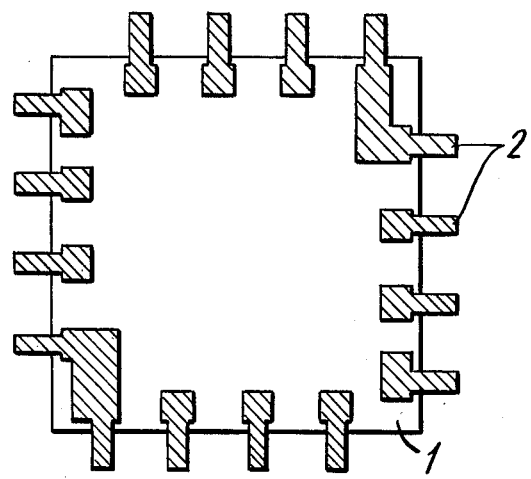
FIG. 1 is a top view of an electronic chip having beam leads as above discussed.
Figure 2:
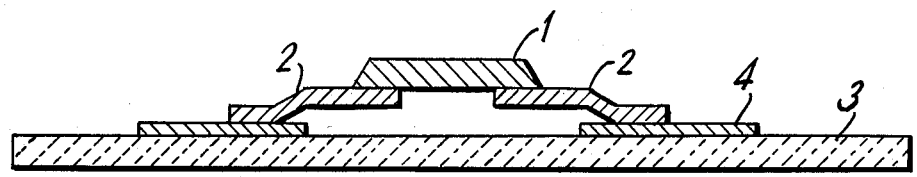
FIG. 2 is a side view illustrating a chip secured to a substrate via beam leads as also discussed above.
Figure 3:
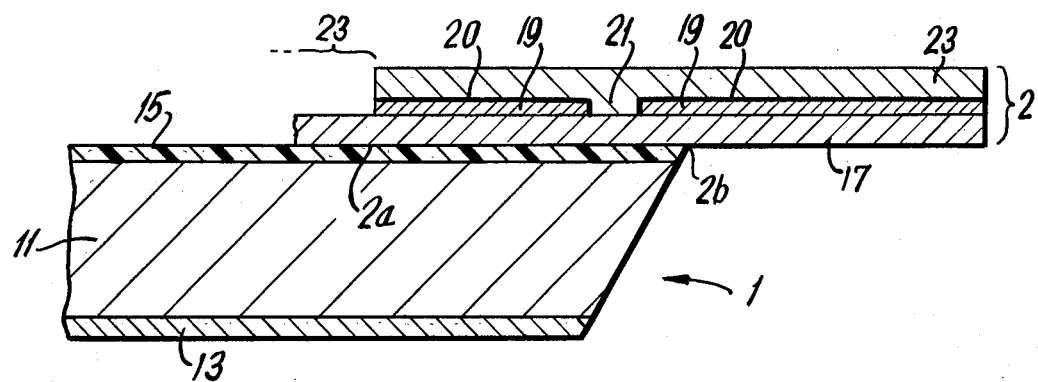
FIG. 3 is a cross sectional diagram depicting a beam lead arrangement in accordance with the principles of the present invention.

Referring now to FIG. 3 there is shown a portion of a chip 1 having a beam lead 2 incorporating the principles of the present invention. As previously noted, the chip 1 may comprise any microelectronic device well known to those skilled in the art, e.g., a thin film resistor network, integrated circuit, a semiconductive device well known to those skilled in the art, e.g., a thin film resistor network, integrated circuit, a semiconductive device array of such devices, or the like. For specificity, and without limitation, the particular beam lead 2 shown in the drawing is depicted as secured to a portion of a thin film resistor, e.g., a tantalum-nitride resistor having a truncated active portion 23 shown in the drawing. The chip 1 for the assumed resistor application includes a body 11 of silicon having silicon dioxide surfaces 13 and 15 on the opposite surfaces thereof.

With particular respect to the beam lead configuration, the beam lead 2 comprises a laminate having a lower adhesion layer 17, e.g., formed of the same tantalum nitride material as the thin film resistance 23 in the resistor application. As the intermediate beam lead 2 laminate layer, there is included a barrier metal layer 19, e.g., a palladium, which for purposes of the present invention includes a void or discontinuity 21 oriented transverse to the axial extent of the beam lead 2. Finally, beam lead bulk, body layer 23, e.g., of gold, forms the final constituent of the composite lead 2.

As alluded to hereinabove, the beam lead of the instant invention exhibits generally superior mechanical integrity and resistance to applied forces vis-a-vis conventional, prior art beam leads. In particular, when a force is applied to the end of a lead 2 normal to the chip 1 (upwards in FIG. 3), the beam lead 2 does not act as a rigid cantilever as was heretofore the case, where the relatively rigid lead pivoted about the point 2a to delaminate the lead 2 from the chip 1, acting first in the area 2b at the edge of the chip and progressing to the pivot point. To the contrary, any upward force supplied to the free (right in FIG. 3) end of the lead now causes the lead to bend in two straight line segments about the discontinuity 21. In particular, a relatively rigid intermetallic compound 20 formed at the interface of the gold 23 and palladium barrier layer 19 is discontinuous about area 21 such that a force applied to the right portion of the lead causes the lead 2 to deform into two straight line segments with area 21 as a pivot rather than the point 2a as was heretofore the case. Accordingly, beam leads fabricated in accordance with the principles of the present invention withstand very substantially higher applied forces than prior art beam lead constructions. By way of example, wherein for prior art arrangements applied forces of 1 to 1.5 grams per mil of beam width are sometimes difficult to withstand without causing the lead to strip from the chip, beam leads of the instant invention have readily withstood applied forces exceeding 3 grams per mil of beam width. Indeed, lead breakage under test conditions for the beam lead of the instant invention often occurs at or to the right of the discontinuity 21 in FIG. 3, leaving intact the bonding of the lead to the chip 1.

The method of making the beam lead construction of the instant invention will be readily apparent to those skilled in the art. Indeed for any contemplated devices where beam leads of the instant invention are to replace conventional beam leads, all that is required is a change in the mask for etching the barrier layer 19 such that the photo resist covering the discontinuity area 21 is developed away (or remains) prior to barrier layer etching (or deposition) — assuming, as is common place, fabrication of the microelectronic device employing photolithograph techniques. However, we present below a brief description of fabrication of the assumed resistive device, more for completeness for those not participating in this art rather than from any conviction that those skilled in the art will gain therefrom.

As a starting point, a silicon wafer 11 approximately 8 to 10 mils thick is procured having two silicon dioxide surface layers 13 and 15, each approximately 13,000–15,000 A°. Alternatively, the silicon wafer 11 may be polished on each surface, and have the oxide grown thereon, as by thermal oxidation. So called "streets" of aluminum are deposited on the upper or active surface of the chip, i.e., about the upper surface of the oxide layer 15. The aluminum streets define the physical bounds of each of the many chips formed during processing of one wafer, and are used as one electrode in the gold plating operation later utilized to form the composite beam lead arrangement shown in FIG. 3. As one of the final processing steps, the aluminum is removed, together with all wafer material surrounding each chip so that the chips come apart when wafer processing is completed. To form the silicon dioxide and aluminum streets, photo resist is applied atop the surface of the silicon dioxide layer 15, and then exposed to a mask which irradiates the "street" lines in the photo resist. Assuming a positive photo resist, resist in the street areas is exposed and developed away, such that "street" lines are thereafter etched in the underlying silicon dioxide, e.g., by chemical etching in buffered hydrofluoric acid, down to a thickness of approximately 2,000 A°. The aluminum is then placed in the depressed street grooves, as by covering the entire surface with photo resist and developing away resist in the street areas, and depositing aluminum in the street areas, as by vapor deposition.

As the next substantial step (those skilled in the art will obviously appreciate that intermediate surface cleaning operations are employed), a sheet of tantalum nitride is deposited over the entire upper surface of the chip, as again by reactive sputtering. Such sputtering may comprise ionic bombardment of a tantalum target in an environment of argon (e.g. 35 microns pressure) doped with nitrogen (e.g., $5 \times 10^{-4}$ Torr.), such that the tantalum nitride sheet is formed to a thickness of 2,000 A°. Again it will be appreciated by those skilled in the art that alternative means for forming the tantalum nitride may be employed as well, e.g. vapor or plasma deposition, ion plating and the like.

Similarly, the upper sheet of tantalum nitride 17 is covered with a continuous barrier layer 19, e.g., by reactive sputtering from a palladium target or by employing the other procedures discussed above. We have found it convenient to sputter both the tantalum nitride and the barrier palladium without breaking vacuum.

Photo resist is placed atop the palladium, and then exposed with a mask such that, upon developing, the protective photo resist cover is removed from the palladium over the entire resistor active area 23- and also in the discontinuity zones 21 of the beam leads and between beam leads. After developing to strip the photo resist from these areas, the palladium is etched away, as by chemical etching in a mixture of potassium iodide, iodine and water. A further photo resist covering and developing process is then effected to remove the photo resist from that portion of the active area of the tantalem nitride in the active zone 23 not corresponding to the resistor pattern finally required, and from the areas not corresponding to beam leads. After developing the photo resist, the tantalum nitride is formed to the desired resistance pattern, as by sputter etching the tantalum nitride away through the exposed areas in the photo resist. Obviously again, any other form of tantalum nitride etching may be employed, e.g., chemical or plasma etching. At this point, then, the active or upper surface has a desired tantalum nitride resistor pattern connected to the lower adhesion layer 17 of tantalum nitride which was integrally formed therewith, together with the covered palladium barrier layer with the discontinuity 21 formed therein.

The next step is to operate on the back side of the wafer, i.e., on the side of the oxide 13, to scribe the bounds of each chip 1 of the many such chips included on each original wafer. This may be done by a photo resist cover and mask exposure to etch away first the resist and then the oxide 13 in the "street" lines corresponding to that originally done at the upper, or active surface of the chip, again as by buffered hydrofluoric acid chemical etching for the oxide.

Returning to the front or active side of the device, the wafer is covered with photo resist which is developed away over the beam lead areas only. The wafer is inserted in an electroplating bath having one potential applied to a gold bath electrode, and the other potential applied to the aluminum grid previously formed in the street areas. The gold electrode is thus electrodeposited atop the exposed palladium beam lead segments 19, and atop the tantalum nitride exposed in the discontinuity zone 21.

After the gold deposition is completed, the street aluminum material is stripped away, as by an aluminum etching solution of nitric, phosphoric and acetic acid, and the remaining 2,000A° or so of silicon dioxide in the street area removed as by a buffered hydrofluoric acid bath. The resistor assembly is placed in an oven, e.g., at 450° C. for approximately 6 minutes, to passivate the then exposed outer surface of the tantalum nitride in the active areas 23 to the desired, final resistance value. The passivation is effected by creating a surface layer of tantalum pentoxide.

The wafer is secured to a holding plate, e.g. sapphire, as by wax bonding, and the street areas marked on the oxide layer 13 sawed through as by a diamond saw, for a substantial part of the thickness of the silicon 11.

Separation of the chips of the wafer is then completed, as by a chemical etch of potassium hydroxide dissolved in methanol which will etch away the remaining thickness of silicon 11 into the street area, but which will not attack the other materials in contact therewith, to complete fabrication of the beam lead device shown in FIG. 3.

The above described beam lead arrangement and methodology is merely illustrative of the principles of the present invention. Numerous modifications and adaptations thereof will be readily apparent to those skilled in the art without departing from the spirit and scope of the present invention. For example, it will be readily appreciated that the discontinuity 21 may be formed in the adhesion layer 17 instead of, or in addition to that in the barrier layer 19.

What is claimed is:

1. In combination in a microelectronic device, a chip and at least one beam lead affixed to said chip, said beam lead being characterized by an axial direction and a transverse direction substantially orthogonal to said axial direction, said beam lead comprising a laminate including an adhesive layer affixed to said chip, an intermediate barrier layer, and a beam layer disposed on the side of said barrier layer opposite to said adhesive layer, said beam lead having an axial extent in its said axial direction partly overlapping said chip and partly extending beyond the periphery of said chip, wherein said barrier layer includes an intermediate discontinuity therein extending in said transverse direction, said barrier layer including first and second portions spaced in said axial direction by said intermediate discontinuity, whereby said transverse discontinuity increases the peel resistance of said beam lead by permitting beam lead bending about said discontinuity rather than lead-chip separation.

2. A combination as in claim 1 wherein said adhesion layer is selected from the group consisting of tantalum, tantalum nitride, tantalum oxinitride, titanium, nicrome and cermet, wherein said barrier layer is of a material selected from the group consisting of palladium and platinum, and wherein said beam material is selected from the group consisting of gold and aluminum.

3. A combination as in claim 2 further comprising additional beam leads affixed to said chip, at least one electronic element formed on said chip, and means connecting said electronic element to at least one of said lead or said additional beam leads.

4. In combination with a microelectronic device, a chip and at least one beam lead affixed to said chip, said beam lead comprising a laminate including an adhesive layer affixed to said chip, an intermediate barrier layer, and a beam layer disposed on a side of said barrier layer opposite to said adhesive layer, said beam lead having an axial extent partly overlapping said chip and partly extending beyond the periphery of said chip, wherein said adhesive layer includes an intermediate discontinuity therein extending in a direction transverse to the axial extent of said beam lead, wherein said adhesive layer includes first and second portions spaced in said axial direction by an intermediate discontinuity disposed in said transverse direction, whereby said transverse discontinuity increases the peel resistance of said beam lead by permitting beam lead bending about said discontinuity rather than lead-chip separation.

5. A method of reducing the deleterious effect on forces applied to a beam lead affixed to an electronics-bearing chip comprising the steps of forming an adhesion layer adjacent to the chip, forming an intermediate barrier layer over said adhesion layer, and forming an outer beam lead body layer over said barrier layer, the improvement comprising the step of forming a discontinuity in at least one of said barrier layer or adhesion layer in a direction transverse to the axial extent of said beam lead whereby said transverse discontinuity increases the peel resistance of said beam lead by permitting beam lead bending about said discontinuity rather than lead-chip separation.

* * * * *

UNITED STATES PATENT OFFICE
CERTIFICATE OF CORRECTION

Patent No. 4,112,196    Dated September 5, 1978

Inventor(s) THOMAS R. SELIG et al

It is certified that error appears in the above-identified patent and that said Letters Patent are hereby corrected as shown below:

IN THE CLAIMS:

Claim 3, Column 6, line 36 -

--beam-- should precede first "lead" in the line

Signed and Sealed this

Twelfth Day of June 1979

[SEAL]

Attest:

RUTH C. MASON
*Attesting Officer*

DONALD W. BANNER
*Commissioner of Patents and Trademarks*